ACTIVE LOW PASS FILTER

Filed July 11, 1966 4 Sheets-Sheet 1

INVENTORS
DOUGLAS J. WIEST
HANS E. WEIDMANN
BY Thomas C. Schatzel

INVENTORS
DOUGLAS J. WIEST
HANS E. WEIDMANN
BY Thomas C. Schatzel

INVENTORS
DOUGLAS J. WIEST
HANS E. WEIDMANN
BY Thomas C. Schatzel

INVENTORS
DOUGLAS J. WIEST
HANS E. WEIDMANN
BY Thomas E. Schatzel

United States Patent Office 3,414,824

Patented Dec. 3, 1968

3,414,824

ACTIVE LOW PASS FILTER

Hans E. Weidmann, Whiefish Bay, and Douglas J. Wiest, Shorewood, Wis., assignors to Allen-Bradley Company, Milwaukee, Wis., a corporation of Wisconsin Filed July 11, 1966, Ser. No. 564,212

11 Claims. (Cl. 328—167)

The present invention pertains to active low pass filters and more specifically to active low pass filters having high attenuation of very low frequency current signals while being able to handle large amounts of power. In general, the filter comprises a transconductance amplifier extending intermediate a direct current power source and a direct current powered load device which amplifier when in a conductive state provides a low impedence path to a ground reference plane for alternating current signals drawn by the load from the power source; a sensing means extending between the load and the source to sense the alternating current signals as the load varies, the sensing means providing an input voltage signal to the transconductance amplifier in accordance with the variations of the load; and electrical energy storage means intermediate the amplifier and the load, the storage means supplying direct current energy to the load means; and an inductive acting device intermediate the amplifier and the electrical energy storage means which inductive acting device provides a high impedance path to the alternating current components of pulse signals looking back from the load to the power source and a low impedance to direct current signals passing from the source to the load. The invention further pertains to overload protection incorporated in combination with the active filter network.

The active low pass filter has wide applications for current-drawing, variable-load devices, especially in applications requiring filtering at the input side of an electrical load. For example, in the communications field wherein a Teletypewriter drawing direct current pulses is utilized, as the various signals are coded current pulses are generated across the load input. In the absence of a filter, these pulses appear on the conducting lines extending between the direct current power source and the load. The frequency spectrum of these pulses range upward from direct current. A key disadvantage is that these current pulses are related to the transmitted message. Thus, the power lines may be sensed and the information sent by the Teletypewriter decoded. This is obviously an undesirable feature if the information sent by the Teletypewriter is intended to be of a secret nature. It is thus desirable that the pulses be suppressed and filtered near the load input.

In the past passive filter networks incorporating inductors and capacitors have been utilized and proven satisfactory from an electrical viewpoint. However, due to the very low frequency components of the undesired signals these passive networks are very large in size and of considerable physical weight. Also, since the filter is positioned intermediate the power source and the load it is necessary that it be capable of handling large amounts of power, again requiring large bulky devices. Obviously, in this era of miniaturization such passive filters pose problems. At the present time there are many types of active filters used in various applications. However, they are generally used in low power applications and their purpose is to filter low power interference in the form of voltage rather than a current. Also filters used in the communication area are generally of the voltage type and are of low power capability.

Normally active filters suppress interference voltage signals flowing in the same direction as the power frequency signals. In the present invention, however, the signals are of a current form and flow in the opposite direction than the power signal. The filter is placed on the input side of the load device and prevents interference from flowing from the load to the power source. Furthermore, all active filters need a power source and in the present filter the filter is energized by the power source which it simultaneously filters.

In the following discussion pertaining to specific embodiments, there will be discussed a filter network designed to accompany a sophisticated power supply having internal overload protection and high ripple current regulation and also a filter network in combination with protecting circuitry designed to accompany power supplies without internal overload protection and poor ripple voltage regulation.

Accordingly, for a more detailed understanding of the present invention illustrated embodiments will be hereinafter discussed in connection with the accompanying drawings.

Figure 1:
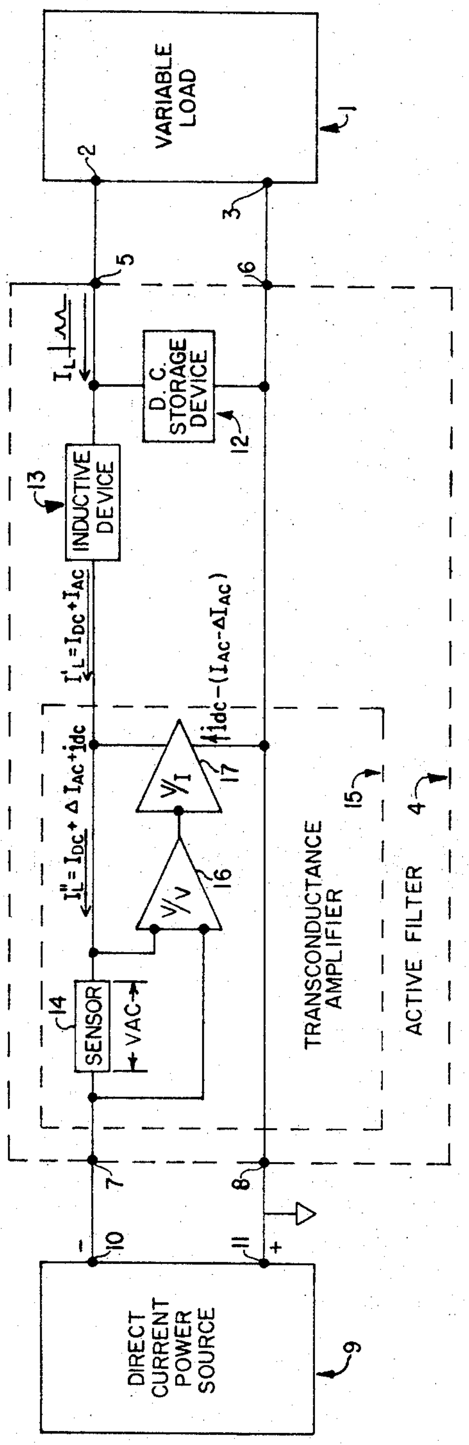
FIG. 1 illustrates in block diagram form, the combination of a direct current variable load device supplied by a direct current source and carrying intermediately an active filter according to the teachings of the present invention.

FIG. 1 illustrates in block diagram form a circuit network of the present invention. In the diagram a variable load, referred to by the general reference character 1, and carrying a pair of input terminals 2 and 3 is shown tied to an active filter network, referred to by the general reference character 4 and carrying a pair of output terminals 5 and 6. For illustrative purposes the variable load 1 may be a Teletypewriter. The filter network 4 carries a pair of input terminals 7 and 8 common with a direct current power source referred to by the general reference character 9 and carrying a pair of output terminals 10 and 11. As illustrated, the terminals 3, 6, 8 and 11 are all common to a ground reference plane. The active filter 4 includes a direct current storage device 12 which extends across the terminals 5 and 6. The storage device 12 may be in the form of an electrical capacitor charged by the direct current power source 9. The storage device 12 provides energy to the variable load 1 and pulses, designated $I_L$, are generated coinciding with the changing load. Extending between the direct current power source 9 and the storage device 12 is an inductive acting device 13. The device 13 is inductive acting in the sense that for the signals attempting to pass between the output terminal 5 and the input terminal 7 it provides a high impedance to the alternating current components of the load current $I_L$ and a low impedance to the direct current component. Thus, the current designated $I'_L$ passing through the inductive acting device 13, ideally consists of direct current. But since the impedance to the alternating currents is not infinite some alternating current components, designated $I_{AC}$ pass through the device 13. Intermediate the inductive acting device 13 and the direct current power source 9 is a low impedance sensing device 14 which may be in the form of a small resistor, a current transformer or an active device. Through the sensing device 14 flows a current $I''_L$ comprising a direct current portion and a small increment $\Delta I_{AC}$ of the alternating current $I_{AC}$. Across the sensing device 14 is the input of a transconductance amplifier network, referred to by the general reference character 15 and comprising a voltage amplifier 16 and a voltage/current amplifier 17. The conductive state of the amplifier 16 is determined by the alternating current potential across the sensing device 14 while the conductive state of the amplifier 17 is controlled by the output of the amplifier 16. Connected in the closed loop configuration as illustrated, the current amplifier 17 draws a direct current bias $i_{DC}$ and most of the alternating current components of the load current portion $I'_L$. Accordingly, the filter 4 provides a low impedance path to the common ground plane for the major portions of the alternating current components of the current $I'_L$. Thus the current passing through the power source 9, designated $I''_L$, comprises the direct current component and the small error increment $\Delta I_{AC}$. It may be noted that the filter 4 is required to pass the power delivered by the power source 9 to the load. This is commonly in excess of a hundred watts. It may also be noted that the power source 9, which is filtered by the filter 4, also provides power to the active filter 4.

Figure 2:
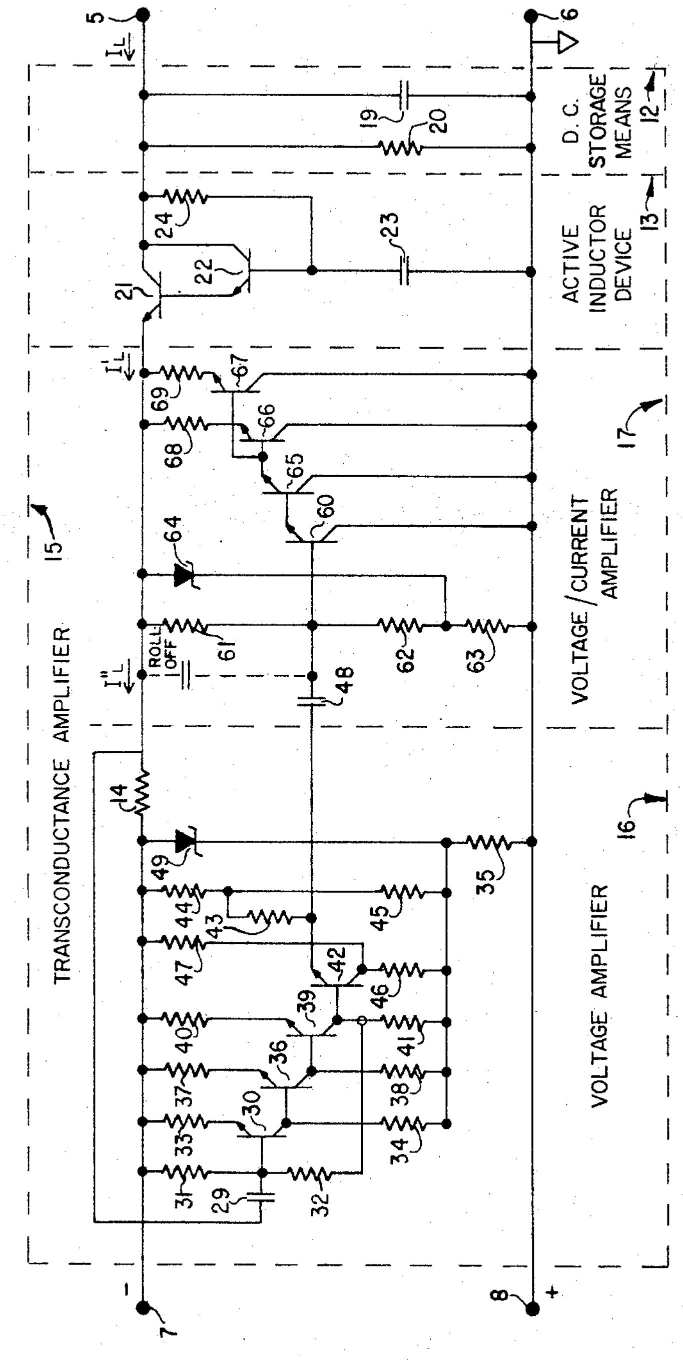
FIG. 2 is a circuit diagram of an active filter of the present invention.

In FIG. 2 the active filter 4 is illustrated in more detail. The electrical energy storage means 12 includes a capacitive element 19 extending in parallel across the output terminals 5 and 6 and in parallel with a resistor 20. The resistor 20 provides a continuous small load to the filter 4 so that the working conditions of the filter are defined. The inductive acting device 13, indicated Active Inductor Device, includes a first control valve in the form of a NPN transistor 21 and a second control valve in the form of a NPN transistor 22 with the collectors tied in common to the output terminal 5. The emitter of the transistor 22 is common with the control gate or base of the transistor 21 and the control gate or base of the transistor 22 is tied to a capacitor 23. The capacitor 23 permits the base of the transistor 22 to be at ground potential for alternating current signals and above ground potential for direct current. Intermediate the base of the transistor 22 and the common connected collectors is a base bias resistive component 24.

The emitter of the transistor 21 is connected in common to the sensing device 14, illustrated in the form of a small resistor. The other end of the sensing device 14 is common to the input terminal 7, which is above ground potential.

The sensing resistor 14 is also tied across the input of the transconductance amplifier 15. The potential across the resistor 14 provides an inpot signal through a coupling capacitor 29 to a voltage amplifier 16 in the form of a three-stage, common emitter amplifier. The amplifier 16 includes a first NPN transistor 30, the base of which is tied to the capacitor 29. Extending between the base of the transistor 30 and the other side of the sensing resistor 14 is a bias resistor 31. The base is also common to a feedback resistor 32 which stabilizes the operating point. The emitter of the transistor 30 extends to the sensing resistor 14 through a feedback resistor 33 which provides negative feedback securing electrical and thermal stability. The collector of the transistor 30 extends to the common ground plane through a first resistor 34 and a common resistor 35. The collector also extends to the base of an NPN transistor 36 which serves as the second stage of amplification for the voltage amplifier 16. The emitter of the transistor 36 extends to the sensing resistor 14 through a feedback resistance 37 while the collector of the transistor 36 extends to the ground plane through a first resistor 38 and the common resistor 35. The collector of the transistor 36 also extends to the base of the NPN transistor 39 which serves as the third stage of amplification for the voltage amplifier 16. The emitter of the transistor 39 extends to the sensing resistor 14 through a feedback emitter resistor 40 while the collector extends to the ground plane through a first resistor 41 and the common resistor 35. The collector of the transistor 39 also extends to the other end of the feedback resistor 32.

Also joining the collector of the transistor 39 is the base of an NPN transistor 42. The transistor 42 serves as part of a clipper stage limiting the input drive to the current amplifier 17 to avoid over driving the current amplifier. The emitter of the transistor 42 extends to the sensing resistor 14 through a pair of resistors 43 and 44. The emitter also extends to the ground plane through the resistor 43, a resistor 45 and the common resistor 35. The collector of the transistor 42 extends to the ground plane through a first resistor 46 and the common resistor 35 and also extends to the sensing resistor 14 through a collector resistor 47. The combination of the resistors 43, 44, 45, 46 and 47 provides a voltage divider which values set the voltage difference between the emitter-collector junction of the transistor 42. The emitter of the transistor 42 extends to the input of the current amplifier 16 through a coupling capacitor 48. As illustrated, for regulation of the voltage amplifier 16 a Zener diode 49 extends across the high potential terminal 7 and the ground plane through the common resistor 35 with the anode tide to the terminal 7 and the cathode tied to one side of the resistor 35. The resistor 35 serves as a dropping resistor to provide a potential drop between the ground plane and the Zener 49.

The voltage/current amplifier 17 is illustrated in the form of a three-stage common-collector, Darlington circuit configuration. The amplifier 17 includes a first NPN transistor 60 with the base common to the coupling capacitor 48. The base of the transistor 60 extends to the high potential terminal 7 through a base bias resistor 61 and to the ground plane through a pair of resistors 62 and 63. Extending between the high potential terminal 7 and the junction of the resistors 62 and 63 is a Zener diode 64 with the anode tied to the terminal 7. The Zener diode 64 maintains bias voltage regulation for the current amplifier 17 and the resistor 63 serves as a dropping resistor to provide a potential drop between the ground plane and the Zener 64. The collector of the transistor 60 is common to the ground plane while the emitter is common to the base of a second NPN transistor 65. The collector of the transistor 65 is common to the ground plane while the emitter is tied to the base of a transistor 66 and the base of a transistor 67. The transistors 66 and 67 are operated in parallel with the emitters of the transistors 66 and 67 tied to the high potential terminal 7 through a pair of emitter resistors 68 and 69, respectively. The collectors of the transistors 66 and 67 are tied to the ground plane.

For the theory of operation assume that the Teletypewriter is the load and that the objective is to filter out or attenuate those frequency components ranging from 3 Hz. to 100 kHz. With the power applied, the capacitor 19, which may be in the order of several thousand microfarads, charges to approximately the potential across the terminals 7 and 8. As the Teletypewriter is keyed, the capacitor discharges and provides energy in the form of current pulses $I_L$. This discharge of the capacitor 19, in turn, causes the power source 9 to deliver current pulses to recharge the capacitor 19. Thus, in the absence of the filtering network 4 the load current fluctuations appear in the absence of filtering network 4 the load current fluctuations appear in the power supply source such that by sensing the potential across the power lines leading to the terminals 10 and 11 the information sent by the Teletypewriter can be decoded. These signals contain frequency components ranging upward to hundreds of kHz. Filtering of these signals is accomplished by the active filter herein described. The current $I_L$ is divided between the capacitor 19 and inductive acting device 13. This division, of course, is frequency dependent. Due to the impedance division of the capacitor 19 and the inductive acting device 13 small current $I'_L$ flows toward the transconductance amplifier 15.

In the closed loop configuration, a small portion $\Delta I_{AC}$ of the current $I'_L$ passes through the sensing element 14 and a voltage $V_{AC}$ is developed. The voltage $V_{AC}$ is detected through the coupling capacitor 30 by the input of the amplifier 16. By proper selection of the components of the amplifier 16 and the sensing element 14 the conductive state of the amplifier may be controlled by the alternating current components of the potential across the sensing element 14. Generally, the impedance of the sensing element 14 is very small, e.g., fractions of an ohm so that the potential drop across the sensing element 14 is nominal. The voltage amplifier 16 amplifies the sensed signal and controls the conductive state of the common-emitter current amplifying network 17. The transistors 60 and 65 of the voltage/current amplifier 17 amplify the current thereby controlling the conductive state of the transistors 66 and 67 each of which are biased by the direct current $i_{DC}$. This closed loop configuration then presents a very low impedance path for the alternating current signals $I_{AC}$ of the current $I'_L$ passing through the collector-emitter stage of the transistor 21. Thereby, all except a small fraction $\Delta I_{AC}$ of the alternating current components are directed to ground and prevented from appearing across the terminals 7 and 8 leading back to the power supply source 9.

Figure 3:
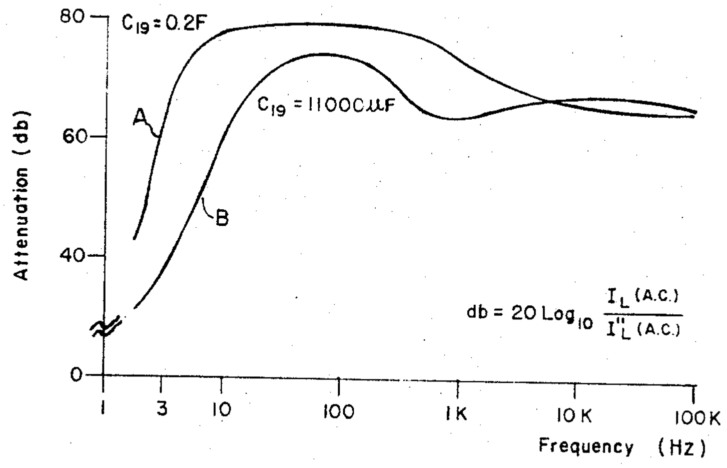
FIG. 3 is a graph illustrating the attenuation versus frequency of the active filter of FIG. 2.

FIG. 3 illustrates the attenuation versus frequency response for the filter of FIG. 2. The conditions under which the response was measured includes a voltage amplifier 16 with an amplification factor in the order of five hundred, a voltage/current amplifier 17 with a transconductance in the neighborhood of 1.5 amps/volt, a sensing resistor 14 in the order of the one tenth of an ohm, a direct current voltage supply in the order of 36 volts with the terminal 7 being negative with respect to ground, a direct current bias $i_{DC}$ for the current amplifier 17 in the order of one-half ampere and the alternating current potential values across the storage capacitor 19 being in the order of two volts peak to peak superimposed in the direct current voltage value. In FIG. 3 two curves A and B are shown, curve A coinciding with a capacitor 19 in the order of 0.2 farad and curve B for a capacitor 19 in the order of 11,000 microfarads. It may be noted that curve A has an attenuation of 60 decibels at three Hz. and curve B an attenuation of 60 decibels at ten Hz. Attenuation of the filter 4 in this instance is defined at the product of twenty times the logarithm of the ratio of the alternating current portions of the signal at the output terminals and the alternating current portions of the signal at the input terminals. It may be further noted from curves A and B that there is a point at which the attenuation tends to dip. The dip occurs due to the overlap of the upper frequency roll-off of the transconductance amplifiers 15 and the response of the network comprising the capacitor 19 and the inductive acting device 13. To improve the electrical stability of the amplifier a roll-off capacitor may be incorporated to limit the frequency response of the transconductance amplifier. For example, viewing FIG. 2 a roll-off capacitor may be incorporated across the resistor 61 as designated by the broken line capacitor circuit. In this manner the roll-off capacitor decreases the amplifier gain with increasing frequency. Thus, the frequency response of the transconductance amplifier 15 rolls off at a lower frequency than would be the case without the roll-off capacitor. The advantages realized by the roll-off capacitor includes a more linear response for the active filter 4 and improved electrical stability of the amplifiers 16 and 17 to minimize the possibility of oscillations.

Figure 4:
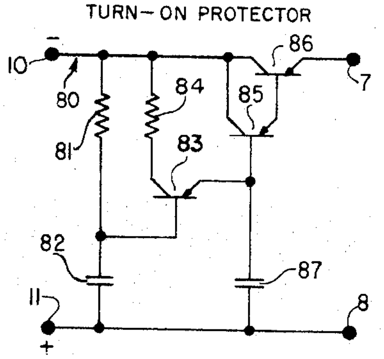
FIG. 4 is a circuit diagram of a ripple regulator and turn-on protector which may be used in combination with the filter of FIG. 2 to guard against high in-rush currents and undesirable ripple signals from the power supply source.

FIG. 4 illustrates what is referred to as a Ripple Regulator and Turn-On Protector network, designated by the general reference character 80. The network 80 may be connected intermediate the power source 9 and the transconductance amplifier 15. The object of the regulator-protector 80 is to protect the transistor 21 of the inductive acting device 13 against high in-rush current and also to provide additional ripple regulation in the event of a power supply with poor ripple regulation and/or without internal in-rush current protection. In the absence of a ripple regulator, a higher ripple current is developed and consequently sensed by the sensing device 14. The device 14 then develops an alternating current voltage thereby placing the transconductance amplifier 15 in a conductive state making it unavailable for its purpose of filtering out the alternating current components reflected across the line due to the variable load.

As illustrated the regulator-protector 80 may include a first resistance-capacitor series network comprising a resistor 81 and a capacitor 82 extending across the power supply terminals 10 and 11. Common to the junction of the resistor 81 and the capacitor 82 is the base of a PNP transistor 83 the collector of which is tied to a collector resistor 84 extending to the high potential terminal 10. The emitter of the transistor 83 is common to the control gate of a control valve in the form of a PNP transistor 85 the collector of which is common to the high potential terminal 10 and the emitter of which is common to the control gate of a control valve in the form of a PNP transistor 86. The collector of the transistor 86 is common to the collector of the transistor 85 and the emitter is tied to the input terminal 7 of the transconductance amplifier 15. The base of the transistor 85 extends through a capacitor 87 to the ground plane. Thus, the combination of the resistor 84 and the capacitor 87 comprise a second resistance-capacitance network.

The theory of operation of the network 80 is believed to be here as follows. The energy storage load capacitor 19 across the output of the filter 4 is generally of a large value. Without protection there are high in-rush currents when power is initially applied. The high in-rush currents otherwise have a tendency to be detrimental to the transistor 21. However, by incorporating the network 80, the instant potential is applied the transistor 86 is in a nonconductive state. The time constant of the resistance 81 and capacitor 82 is relatively long such that the capacitor 82 charges gradually. The potential at the emitter of the transistor 86 tends to follow the potential applied to the base of the transistor 83. Due to the relatively large time constant the voltage builds up gradually to nearly meet the power supply value and the load capacitor 19 gradually charges thereby avoiding high in-rush currents. Obviously, many direct current power supplies carry internal in-rush protectors, in which case this feature need not be included.

The combination of the resistor 84 and the capacitor 87 is included to aid in filtering ripple from the current of the power supply 9 if the power supply has inadequate ripple filtering. The time constant of this combination is generally much smaller than that of the resistor 81 and capacitor 82. Once the capacitor 82 is charged, transistor 83 is saturated so that essentially the time constant of the resistor 84 and capacitor 87 provide ripple regulation.

Figure 5:
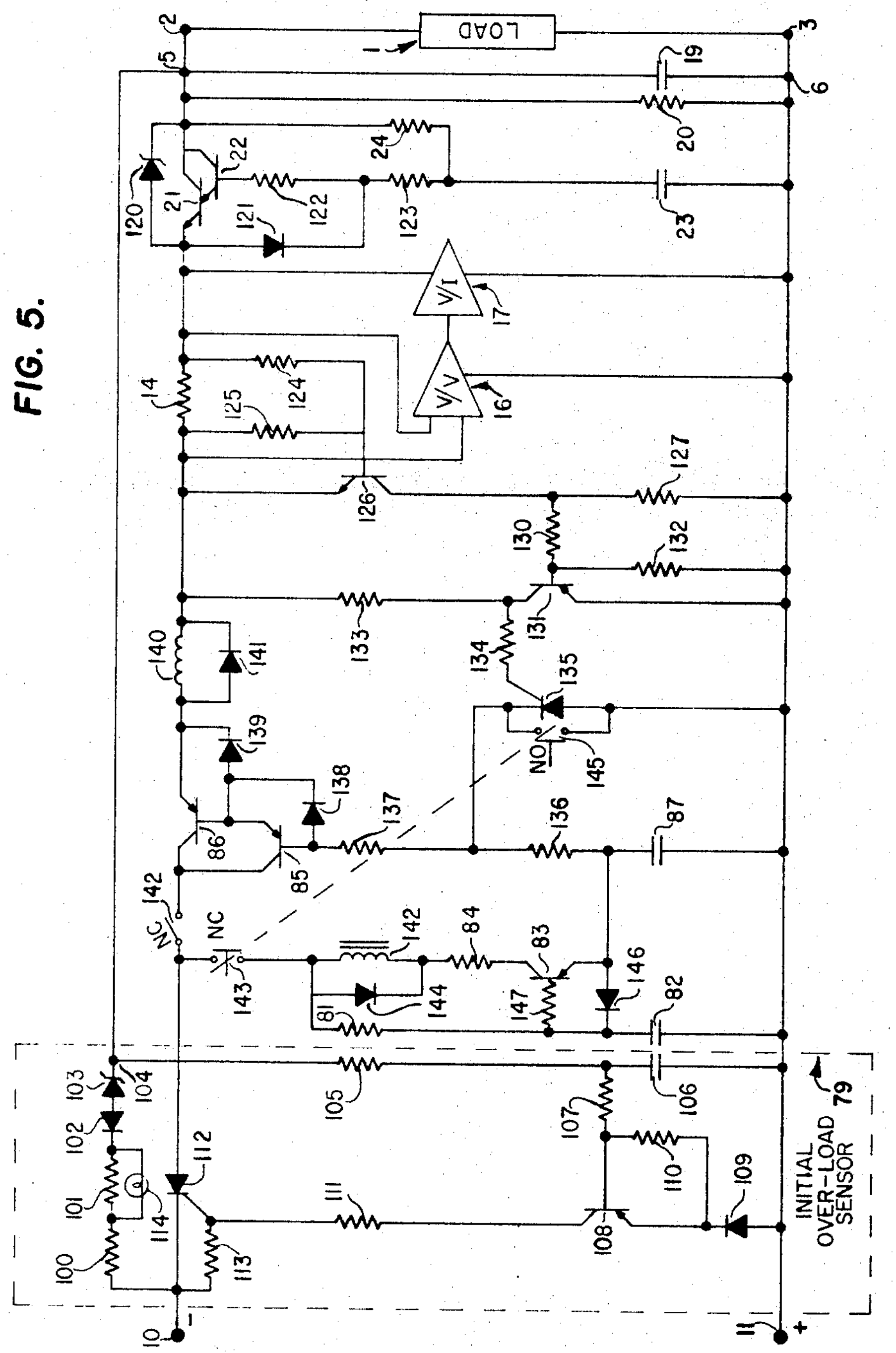
FIG. 5 illustrates the filter network of FIG. 2 and network of FIG. 4 in combination with current over-load protection.

FIG. 5 illustrates network circuitry to protect the filter against current overload. Those components of FIG. 5 similar to FIGS. 2 and 4 carry the same reference numerals while the amplifiers 16 and 17 of the transconductance amplifier 15 are designated symbolically. The protecting circuitry of FIG. 5 is intended to guard against (1) the situation when the network is initially turned on into an overload across the load; and (2) the situation when an overload appears across the load subsequent to turn-on.

In FIG. 5 the circuitry within the block entitled Initial Over-load Sensor, designated by the general reference character 79, provides protection when the filter is initially turned on into an overload. The network renders the filter circuit 4 inoperable until the overload is removed and the potential across the output terminals 5 and 6 reaches normal value. The overload sensor 79 includes a pair of current limiting resistors 100 and 101 in series with a unidirectional conducting device in the form of a diode 102 with the cathode tied to the resistor 101 and the anode tied to the anode of a Zener diode 103. The cathode of the zener diode 103 joins a junction point 104 common to the output terminal 5 of the filter 4. The junction 104 is also common to a bias resistor 105 which forms part of a level detector and firing circuit. The resistor 105 extends to the ground plane through a filter capacitor 106. The junction of the resistor 105 and the capacitor 106 is connected to a current limit resistor 107 which is common to the base of a PNP transistor 108. The emitter of the transistor 108 extends to ground through a unidirectional conducting device in the form of a diode 109 of which the cathode is tied to the emitter and the anode is tied to the ground plane. Extending across the base and the emitter of the transistor 108 is a bias resistor 110. The collector of the transistor 108 extends through a resistor 111 to the gate of a silicon controlled rectifier (SCR) 112. The anode of the SCR 112 extends to the collector of the transistor 86 while the cathode extends to the power supply terminal 10. The gate and cathode of the rectifier 112 are joined by a resistive component 113. Across the current limiting resistor 101 is a sensing device indicated in the form of a lamp 114 which indicates when the filter 4 is not operating.

The theory of operation of the Initial Over-load Sensor 79 is believed to be as hereinafter stated. Assuming that a normal load exists when a potential is supplied across the terminals 10 and 11, current passes through the current limiters 100 and 101, the diode 102 and the Zener diode 103. The junction point 104 is at the same potential as that of the output terminal 5. If a normal load exists across the output terminals 5 and 6 a direct current potential also appears across the resistor 105 and the capacitor 106 charges. Thus current flows through the resistor 107. The transistor 108 conducts and current flows through the collector resistor 111 to the gate of the SCR 112. The SCR 112 fires and the power source supply 9 is applied to the filter network 4.

In the event a short circuit or overload exists across the load terminals 5 and 6, the terminal 104 is at ground or nearly ground potential. In the absence of the initial over-load sensor, the transistor 86 would be destroyed by excessive power during the turn-on procedure since the emitter will rest substantially at ground potential with the collector remaining at the power supply voltage while the current increases. However, with the initial overload sensor 79, the potential developed across the capacitor 106 is not sufficient to place the transistor 108 into conduction, the SCR 112 is not fired and the power supply source 9 is not applied to the filter unit 4. Under these conditions a substantial potential, in the order of the power supply 9 value less the drop across the resistor 100 and the zener diode 103 exists across the resistor 101. The lamp 113 is energized indicating that the filter is not operating and that the nonoperation results from an over-load across the output terminals 5 and 6.

In FIG. 5 the filter network 4, the regulator-protector 80 and the over-load sensor 79 are further illustrated in connection with other circuitry supplementing the filter 4. This supplemental circuitry, hereinafter referred to as After Turn-On Over-Load Protection, senses an overload occurring after the filter 4 has been energized and operating. In the absence of the After Turn-On Over-Load Protection, when the filter 4 is in operation the transistors 21 and 86 carry substantial direct current. If a short or large load appears across the output terminals 5 and 6, the current increases which may cause the transistors 21 and 86 to exceed their current or power dissipation rating. This excess of power would tend to destroy the transistors 21 and 86. However, the After Turn-On Over-Load Protection guards against the transistors 21 and 86 exceeding their current or power dissipation rating by rendering the filter inoperative until the overload is corrected.

The After Turn-On Over-Load Protection includes a zener diode 120 connected across the collector and emitter of the transistor 21 of the active inductor 13 with the anode connected to the emitter. A unidirectional conducting device in the form of a diode 121 extends from the emitter of the transistor 21 to the base of the transistor 22 through a current limiting resistor 122 and to the capacitor 23 through a current limiting resistor 123. Across opposite ends of the sensing device 14 is a current limiting resistor 124 and a thermal-stabilization resistor 125 the opposing ends of which are common to the base of a level detecting NPN transistor 126. The emitter of the transistor 126 extends to the sensor 14 while the collector extends to the ground plane through a load collector resistor 127 such that the conductive state of the transistor 126 is dependent upon the potential across the sensor 14. Also joining the collector of the transistor 126 is a base current limit resistor 130 which is common to the base of a PNP transistor 131 the emitter of which extends to the ground plane. Extending between the base and the emitter of the transistor 131 is a thermal-stabilization resistor 132. The collector of the transistor 131 extends to the sensing device 14 through a collector load resistor 133. The collector of the transistor 131 also extends through a gate current limiting resistor 134 the opposite end of which joins the gate of a silicon-controlled rectifier (SCR) 135. The anode of the rectifier 135 joins the ground plane while the cathode extends to the junction point of a discharge limiting resistor 136 and a base bias resistor 137. The other end of the limit resistor 136 is common to the capacitor 87 of the Ripple Regulator and Turn-On Protector 80 previously discussed. The other end of the resistor 137 extends to the transistor 85 of the regulator-protector 80. Extending between the base and the emitter of the transistor 85 is a unidirectional current conducting device in the form of a diode 138 with the cathode tied to the emitter. Extending across the base and the emitter of the transistor 86 is a unidirectional current conducting device in the form of a diode 139 with the anode joining the base. Also extending between the emitter of the transistor 86 and the sensing device 14 is a choke in the form of a small inductor 140 in parallel with a unidirectional conducting device in the form of a transient suppressing diode 141. The function of the small coil 140, which may be in the order of 30 $\mu$H, is to limit the rate of change of the current when an overload or a short circuit at the load terminals suddenly occurs. The resistor 84 of the regulator-protector 80 is also connected in series with the coil of an electromagnetic relay 142 which coil extends through a normally-closed reset switch 143, In parallel with the coil of the relay 142 is a unidirectional current conducting device in the form of a transient suppressing diode 144. Also across the SCR 135 is a normally-open reset switch 145 ganged with the switch 143. The emitter of the transistor 83 is common to the anode of a unidirectional current conducting device in the form of a diode 146 which extends to the junction of the capacitor 82 and the resistor 81. The base of the transistor 83 is tied to a resistor 147 the opposite end of which is common to the resistor 81.

The theory of operation of the After Turn-On Over-Load Protector is believed to be as hereinafter described. Assuming that the system is operating and that a short or overload is suddenly placed across the output terminals 5 and 6. The overload places the collector of the transistor 21 at substantially ground potential while, without the zener 120 the emitter and base would, at the first instance remain unchanged. Thus, substantially full potential of the power supply 9 would be placed across the transistor 21 while the current remain unchanged. The power dissipation of the transistor 21 would exceed its dissipation rating thereby tending to destroy it. However, with the After Turn-On Protection circuitry, the Zener diode 120 determines the maximum voltage placed across the transistor 21, thus limiting its dissipation. The difference in potential between terminal 10 and the emitter of the transistor 21 will be absorbed by the inductor 140. A finite rate of change of the current through the sensor 14 results. The transistor 86 will not be damaged by power, as its tendency is to saturate during an overload. As the current through the inductor 140 increases, the potential across the sensor 14 rises and the current through the current limiting resistor 124 increases thereby placing the transistor 126 in a conductive state. Once the transistor 126 conducts a potential is developed across the resistor 127 and current is delivered to the base current limiting resistor 130 to the transistor 131. The transistor 131 conducts firing the SCR 135. When the SCR 135 conducts, the base of the transistor 85 is at substantially ground potential thereby placing the transistor 86 in a nonconductive state. Thus, before the current through the small inductor 140 becomes exclusive an open circuit appears and the filter 4 is deenergized. The diodes 121, 138 and 139 are included to protect their respective transistors from being reversed biased when the power supply 9 is disconnected and the capacitor 19 maintains its potential before being discharged by the load.

While the overload exists and the transistor 86 remains nonconductive, current from the terminal 10 passes through the normally-closed reset switch 143, the coil of the electromagnetic relay 142, the resistor 84, the collector-emitter junction of the transistor 83, the resistor 136 and the SCR 135 to the ground plane. The normally-closed contacts of the electromagnetic relay 142 open. The open contacts 142 guard against thermal runaway and consequently secondary breakdown of the transistor 86 caused by leakage. Once the overload is removed, and it is desired to place the filter 4 back in normal operation, the ganged switches 143 and 145 are reset. The contacts of the switch 145 are closed shorting the SCR 135 and cutting its conduction. The ganged nature of the switches 143 and 145 result in opening the contacts of the switch 143 cutting momentarily conduction of the SCR 112 of the regulator-protector 80. When the reset switches are released, the switch 145 assumes the normally-open position and the switch 143 assumes the normally-closed position and the relay contacts 142 are closed. The system is then in condition for normal operation. The diode 146 provides a discharge path for the capacitor 82 in the event the capacitor 87 becomes discharged. This places the capacitor 82 in condition to provide its turn-on protection after the network has been shutdown.

It may be further noted that during the overload condition resulting after turn-on, the terminal 104 is substantially at ground potential. Thus, as in the case of an initial overload, the lamp 114 is energized indicating the overload. It may be further noted, that if the reset switches 143 and 145 are attempted to be reset while the overload still exists, the Initial Overload Sensor 79 senses the overload so that the filter 4 remains deenergized. The After Turn-On Protector of FIG. 5 illustrates the electromagnetic relay 142 and transient suppressing diode 144. In the event that the transistor 86 is of a silicon nature, it may not be necessary to include the relay 142 and diode 144 as the leakage and thermal secondary breakdown may not be of a nature requiring protection. Also, the circuitry of FIG. 5 assumes that power remains applied to the terminals 10 and 11 while the overload condition exists. In the event the power is removed when an overload exists, the reset relays 143 and 145 may be omitted.

In the event an overload appears gradually, as contrasted to the condition when a short is suddenly applied, the current through the transistor 21 increases gradually as does the current through the sensor 14. Thus, the potential across the sensor 14 gradually reaches a value sufficient to fire the transistor 126. When the transistor 126 fires the After Turn-On Protector guards the network from a further increase in load.

We claim:

1. An active low pass electrical filter comprising, in combination:

a pair of input terminal means adapted to receive a direct current power supply source and a pair of output terminal means adapted to receive a variable direct current load, said load having a tendency to draw pulse signals in accordance with load variations, said pulse signals having alternating current components;

a low impendance sensing means extending intermediate one of the input terminals and one of the output terminals that passes direct current power received at the input terminal means, the sensing means developing an electrical potential in accordance with small alternating current components flowing between the input and output terminal means;

an inductive acting device extending intermediate the sensing means and the output terminal means, the inductive acting device providing a high impedance patch between the sensing means and the output terminal means for the alternating current components of the pulse signals and a low impedance path for the direct current power delivered by a direct current power supply source;

a transconductance amplifier intermediate the input terminal means and the inductive acting device, the transconductance amplifier receiving at its input a potential in accordance with the potential developed across the sensing means, said potential controlling the conductive state of the transconductance amplifier, the output of the transconductance amplifier extending between the inductive acting device and a reference plane, the transconductance amplifier when in a conductive state providing a low impedance path for by-passing alternating current signals to the reference plane and away from said input terminal means;

a direct current electrical energy storage means extending across the output terminal means that is charged by a direct current power supply source connected to said input terminal means, the storage means adapted to be supplied in accordance with the direct current potential across the input terminal means and to supply electrical energy to a load extending across the output terminal means.

2. The active low pass electrical filter in accordance with claim 1 in which the inductive acting device includes a first control valve extending in series with the sensing means and the output terminal means, the first control valve further including a control gate extending to the reference plane through a capacitive element.

3. An active low pass electrical filter in accordance with claim 1 in which the transconductance amplifier includes a voltage amplifier and a voltage-to-current amplifier connected in cascade, the conductive state of the voltage amplifier being dependent on the alternating current portion of a potential across the sensing means and the conductive state of the current amplifier being dependent on the conductive state of the voltage amplifier, said voltage-to-current amplifier when in a conductive state according to the alternating current component of the pulse signals providing a low impedance by-pass path for the alternating current components of the signal passing through the inductive acting device.

4. The active low pass electrical filter in accordance with claim 1 in which:

the inductive acting device includes a first control valve extending in series with the sensing means and the output terminal means, the first control valve further including a control gate extending to the reference plane through a capacitive element; and the transconductance amplifier includes a voltage amplifier and a voltage-to-current amplifier connected in cascade, the conductive state of the voltage amplifier being dependent on the alternating current portion of the potential across the sensing means and the conductive state of the current amplifier being dependent on the conductive state of the voltage amplifier, said voltage-to-current amplifier when in a conductive state according to the alternating current components of the pulse signals providing a low impedance by-pass path for the alternating current components of the signal passing through the inductive acting device.

5. The active low electrical filter in accordance with claim 4 in which:

the direct current electrical energy storage means includes a capacitor extending across the output terminal means;

and including a resistive component in parallel with said capacitor, the resistive component providing a continuous small load.

6. The active low pass electrical filter in accordance with claim 4 further including a roll-off capacitor extending across the transconductance amplifier to decrease the gain of the amplifier with increasing frequency.

7. The active low pass electrical filter of claim 2 further including a ripple regulation and turn-on protector comprising a second control valve extending in series between the sensing means and the input terminal means, the second control valve having a control gate extending to a resistance-capacitance charging network, said resistance-capacitance charging network extending across the input terminal means with the conductive state of the control valve depending on the potential across said capacitance.

8. The active low pass electrical filter in accordance with claim 7, further including an initial over-load sensor comprising in combination a current limiter extending between the input terminal means and the output terminal means, a silicon controlled rectifier extending between the input terminal means and the ripple regulation and turn-on protector, a level detector and first firing network extending between the gate of said silicon-controlled rectifier and the current limiter, the conductive state of said level detector controlling the firing state of said silicon-controlled rectifier and the potential across said current limiter controlling the conductive state of said level detector.

9. The active low pass electrical filter in accordance with claim 8, further including an after turn-on over-load sensor including a Zener diode extending across said control valve of the inductive acting device, said Zener diode limiting the maximum voltage placed across said first control valve; a third control valve having a control gate extending to the sensing means, the conductive state of said third control valve being dependent on the potential of the sensing means, a second firing network intermediate the third control valve and a silicon-controlled rectifier, the conductive state of said second firing network dependent on the conductive state of said third control valve, said silicon-controlled rectifier extending between the reference plane and the control gate of said second control valve whereby when an overload occurs and the potential across the sensing means exceeds a predetermined value, the third control valve conducts placing the firing network in a conductive state in turn firing the silicon-controlled rectifier placing the control gate of the second control valve at substantially the potential of the reference plane.

10. The active low pass filter in accordance with claim 9, further including a small inductor extending in series with the sensing means and said second control valve, said inductor limiting the rate of current change through said sensing means.

11. In an active low pass filter the combination comprising:

input terminals for connection to a direct current power supply;

output terminals for connection to a load;

a storage capacitor across the output terminals for dedelivering power to a load, said storage capactor also joined with said input terminals for receiving direct current energy from a power supply;

an alternating current blocking impedance connected between one side of said storage capacitor and said input terminals to impede alternating current components occurring upon discharge of said storage capacitor;

a low impendance alternating current sensor connected between said blocking impedance and the input terminals that develops an alternating current potential corresponding to alternating currents passing through said blocking impedance; and variable impedance shunting means connected in shunt relation to the input terminals and having control leads across said sensor to have the impedance of said shunting means vary in accordance with alternating potential developed by said sensor.

References Cited

UNITED STATES PATENTS

| | | | |
|---|---|---|---|
| 2,994,830 | 8/1961 | Cooke | 307—295 |
| 3,343,003 | 9/1967 | Arseneau | 333—79 X |

JOHN S. HEYMAN, *Primary Examiner.*